United States Patent
Suess et al.

(10) Patent No.: US 10,706,194 B2
(45) Date of Patent: Jul. 7, 2020

(54) BOUNDARY ASSERTION-BASED POWER RECOVERY IN INTEGRATED CIRCUIT DESIGN

(71) Applicant: International Business Machines Corporation, Armonk, NY (US)

(72) Inventors: Alexander J. Suess, Hopewell Junction, NY (US); Cindy S. Washburn, Poughquag, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 16/130,098

(22) Filed: Sep. 13, 2018

(65) Prior Publication Data
US 2020/0089828 A1 Mar. 19, 2020

(51) Int. Cl.
*G06F 17/50* (2006.01)
*G06F 30/3312* (2020.01)
*G06F 30/39* (2020.01)
*G06F 30/327* (2020.01)

(52) U.S. Cl.
CPC ........ *G06F 30/3312* (2020.01); *G06F 30/327* (2020.01); *G06F 30/39* (2020.01)

(58) Field of Classification Search
USPC ................................................ 716/100–109
See application file for complete search history.

(56) References Cited

U.S. PATENT DOCUMENTS

| | | | |
|---|---|---|---|
| 7,551,985 B1 | 6/2009 | Chen et al. | |
| 7,840,918 B1 | 11/2010 | Duthou | |
| 8,239,798 B1 * | 8/2012 | Goyal | G06F 17/5031 716/113 |
| 8,332,802 B2 | 12/2012 | Haugestuen et al. | |
| 8,756,466 B2 | 6/2014 | Allen | |
| 9,443,049 B2 | 9/2016 | Chakrabarti et al. | |
| 9,734,268 B2 | 8/2017 | Berry et al. | |
| 2011/0191738 A1 * | 8/2011 | Walker | G06F 17/50 716/119 |
| 2015/0199465 A1 * | 7/2015 | Alpert | G06F 17/5072 716/122 |

FOREIGN PATENT DOCUMENTS

WO 2011094031 A2 8/2011

OTHER PUBLICATIONS

Luo et al., "Total Power Optimization Combining Placement, Sizing and Multi-Vt Through Slack Distribution Management", IEEE 2008, pp. 352-357.

* cited by examiner

*Primary Examiner* — Binh C Tat
(74) *Attorney, Agent, or Firm* — Cantor Colburn LLP; Erik Johnson

(57) ABSTRACT

Systems and methods of performing boundary assertion-based power recovery in integrated circuit design set boundary assertions based on a specified slack value. A boundary defines a set of components of the integrated circuit and setting the boundary assertions includes specifying arrival times at input pins of the set of components and required arrival times at output pins of the set of components. The method includes performing timing analysis of the set of components and performing the power recovery by replacing ones of the set of components based on a result of the timing analysis. The integrated circuit design is provided for fabrication based on completing the power recovery.

14 Claims, 4 Drawing Sheets

BOUNDARY ASSERTION-BASED POWER RECOVERY IN INTEGRATED CIRCUIT DESIGN

BACKGROUND

The present invention relates to integrated circuit design, and more specifically, to boundary assertion-based power recovery in integrated circuit design.

The process of developing an integrated circuit (i.e., chip) involves a number of phases such as the logic design, physical synthesis, routing, and manufacture. Each of the phases can include multiple processes that may be performed iteratively. In addition to the functional requirements for the chip, the design and subsequent physical implementation must typically conform to timing and power consumption constraints. Timing and power requirements can require a balancing because larger logic gates or gates with lower voltage thresholds, which generally perform faster and improve timing, tend to consume more power. Generally, power recovery is performed after timing optimization on components with positive timing slack (i.e., components that exceed the timing requirement). The timing analysis and optimization can be performed hierarchically by subdividing the complete integrated circuit (e.g., into cores of units that each include macros). Timing analysis for each subdivision (e.g., core, unit, macro) is facilitated by boundary assertions that specify the requisite information at the input pins (PIs) of the subdivision. When the boundary assertions are unnecessarily pessimistic, the design of each subdivision tends to become over-optimized. In this case, power usage is beyond that which is actually required to meet the timing constraints for the chip.

SUMMARY

Embodiments of the present invention are directed to systems and methods to perform boundary assertion-based power recovery in integrated circuit design. A method includes setting boundary assertions based on a specified slack value. A boundary defines a set of components of the integrated circuit and setting the boundary assertions includes specifying arrival times at input pins of the set of components and required arrival times at output pins of the set of components. The method also includes performing timing analysis of the set of components and performing the power recovery by replacing ones of the set of components based on a result of the timing analysis. The integrated circuit design is provided for fabrication based on completing the power recovery.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

DETAILED DESCRIPTION

As previously noted, timing analysis indicates components that are exceeding timing requirements (i.e., exhibit positive slack) and, thus, can be redesigned with components that consume less power. Given the size and complexity of most integrated circuits, hierarchical timing analysis is performed by subdividing the chip at two or more hierarchical levels (e.g., core, unit, macro). To perform timing analysis at a given hierarchical level (e.g., macro), boundary assertions are used as a starting point for values at the input pins of the given subdivision. Conventionally, boundary assertions are based on previous timing analysis of the full chip or on modeling of time delays at the subdivision level (e.g., macro level) or are set manually. However, these boundary assertions are generally too pessimistic. The overly pessimistic boundary assertions result in the design at the subdivision (e.g., macro) having higher timing slack than needed. This, in turn, results in higher power consumption than necessary. Embodiments of the systems and methods detailed herein relate to boundary assertion-based power recovery in integrated circuit design. Specifically, the boundary assertion is set to a threshold value to force a reduction in the pessimism that is introduced in the timing analysis.

Figure 1:
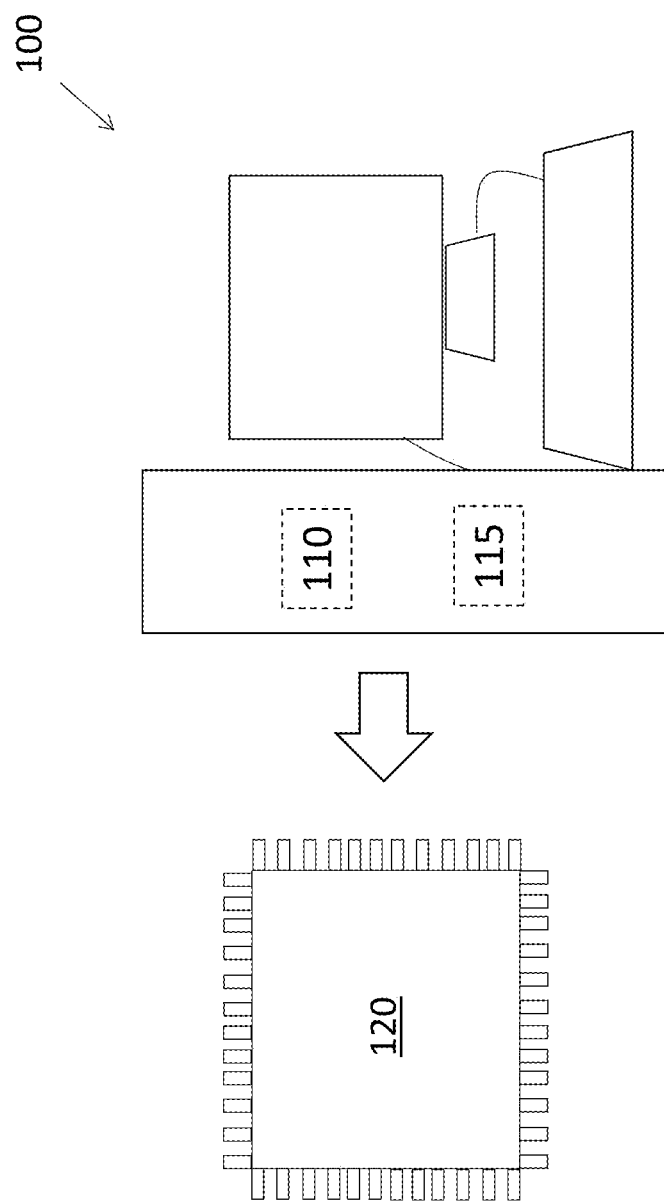
FIG. 1 is a block diagram of a system to perform boundary assertion-based power recovery in integrated circuit design according to one or more embodiments of the invention.

FIG. 1 is a block diagram of a system 100 to perform boundary assertion-based power recovery in integrated circuit design according to one or more embodiments of the invention. The system 100 includes processing circuitry 110 and memory 115 that is used to generate the design that is ultimately fabricated into an integrated circuit 120. The steps involved in the fabrication of the integrated circuit 120 are well-known and only briefly described herein and with reference to FIG. 4. The physical layout is finalized, in part, based on the boundary assertion-based power recovery according to embodiments of the invention. The finalized physical layout is provided to a foundry. Masks are generated for each layer of the integrated circuit 120 based on the finalized physical layout. Then, the wafer is processed in the sequence of the mask order. The processing includes photolithography and etch. The fabrication is further discussed with reference to FIG. 4.

Figure 2:
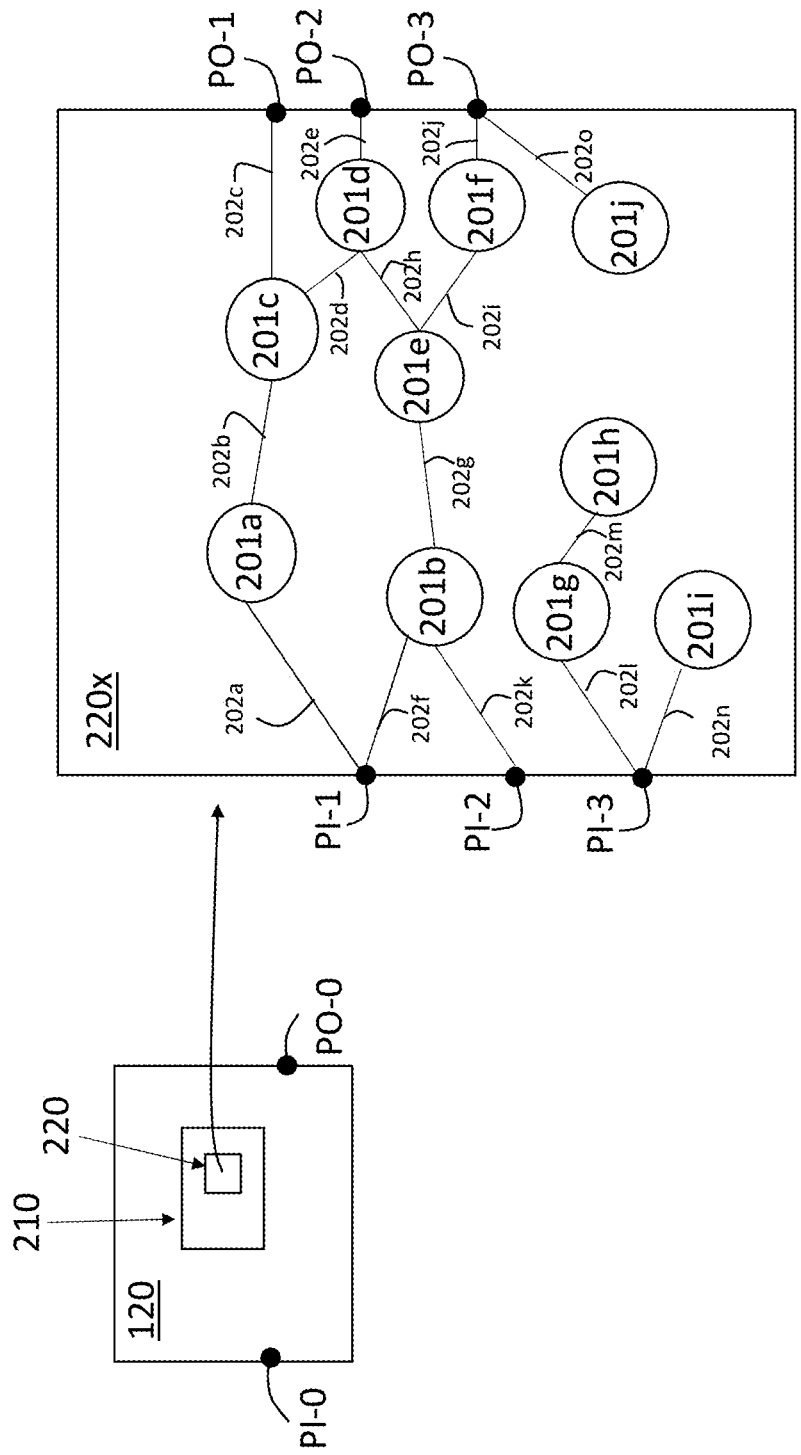
FIG. 2 illustrates a hierarchical timing analysis used to perform boundary assertion-based power recovery in integrated circuit design according to one or more embodiments of the invention.

FIG. 2 illustrates a hierarchical timing analysis used to perform boundary assertion-based power recovery in integrated circuit design according to one or more embodiments of the invention. One input pin PI-0 and one output pin PO-0 are shown for the exemplary integrated circuit 120 for explanatory purposes, but an integrated circuit 120 is likely to have many signals that are input to and output from the chip. In the exemplary case shown in FIG. 2, the integrated circuit 120 is subdivided into units 210 that each include macros 220. Based on the subdivision, the input pin PI-0 of the integrated circuit 120 will be an input to a unit 210 and a macro 220 of the unit which feeds another macro 220 and, ultimately, another unit 210 and the macros 220 within that other unit. The signal from the input pin PI-0 traverses one or more paths across macros 220 of one or more units 210 to reach the output pin PO-0. Similarly, all input signals traverse components of the integrated circuit and can ultimately reach output signals.

Aspects of an exemplary macro 220x are detailed in FIG. 2. The exemplary macro 220x includes three input pins PI-1, PI-2, and PI-3 and three output pins PO-1, PO-2, PO-3. Within the macro 220x, several nodes 201a through 201j (generally referred to as 201) are shown interconnected by edges 202a through 202o (generally referred to as 202). The nodes 201 represent components (e.g., latches, buffers, logic elements) of the integrated circuit 120, and the edges 202 represent the wires that connect them in the integrated circuit 120. As the exemplary macro 220x indicates, every path from an input pin PI does not connect to an output pin PO. For example, input pin PI-3 is not associated with any paths to an output pin PO. Output pin PO-3 is fed by node 201j (e.g., a latch) and that path does not originate at an input pin PI.

As the discussion of the input pin PI-0 and output pin PO-0 makes clear, the input pins PI-1, PI-2, and PI-3 of the exemplary macro 220x are fed from inputs to the integrated circuit 120 (e.g., input pin PI-0) via paths that traverse other macros 220 and, perhaps, other units 210, and the output pins PO-1, PO-2, and PO-3 of the macro 220x lead, through other macros 220 and, perhaps, other units 210, to outputs of the integrated circuit 120 (e.g., output pin PO-0). Thus, the outputs of other macros 220 that feed into the input pins PI-1 and PI-2 affect the timing of the macro 220x.

Timing analysis techniques (e.g., static timing analysis (STA), statistical STA) are well-known and only generally described herein. From each of the input pins PI-1, PI-2, PI-3, an arrival time of a signal is propagated through the nodes 201 and edges 202 of a path and can terminate at a corresponding output pin PO. As FIG. 2 indicates, the path from input pin PI-3 never reaches an output pin PO. In STA, for example, the time delay associated with each node 201 and edge 202 in the path from a given input pin PI is added to the arrival time at the given input pin PI to determine the arrival time at each component along the path. The comparison of the arrival time with the required arrival time (RAT), at the output pin PO or at intermediate nodes 201 in the path, indicates whether there is slack (i.e., a difference between the arrival time and RAT) and whether the slack is positive (i.e., arrival time is earlier than the RAT) or negative (i.e., arrival time is later than the RAT). For example, in the path between input pin PI-1 and output pin PO-1, there are two nodes 201a, 201c and three edges 202a, 202b, 202c. The arrival time at node 201c is the sum of the arrival time at input pin PI-1 and the delay associated with node 201a and edges 202a and 202c. A comparison of the arrival time at node 201c with the RAT for node 201c indicates the slack at node 201c. The arrival time at output pin PO-1 is the sum of the arrival time at input pin PI-1 and the delay associated with each of the nodes 201a, 201c and edges 202a, 202b, and 202c. A comparison of the arrival time at output pin PO-1 with the RAT at output pin PO-1 indicates the overall slack for the path from input pin PI-1 to output pin PO-1.

As previously noted, the arrival time at the input pins PI-1, PI-2, and PI-3 of the exemplary macro 220x can be set based on previous timing analysis of the full chip or on modeling of delays at the subdivision level (e.g., macro level) or are set manually. For example, a model of the unit 210 preceding the unit 210 in which the exemplary macro 220x is found can indicate a negative slack of −20 picoseconds (ps). In this case, all output pins of the preceding unit 210 and, based on a correspondence with the preceding unit 210, at least some input pins PI of the unit 210 in which the exemplary macro 220x is found, can have arrival times set to reflect this negative slack. However, arrival times at pins PI-1, PI-2, and PI-3 reflecting −20 ps are likely too pessimistic. As previously noted, this pessimism can result in potential over-design and unnecessary power usage. Thus, as detailed with reference to FIG. 3, the arrival times at PI-1, PI-2, and PI-3 and the RATs at output pins PO-1, PO-2, and PO-3 (i.e., boundary assertions for exemplary macro 220x) can be set to force a threshold slack value along the most critical paths for purposes of boundary assertion-based power recovery according to one or more embodiments of the invention.

Figure 3:
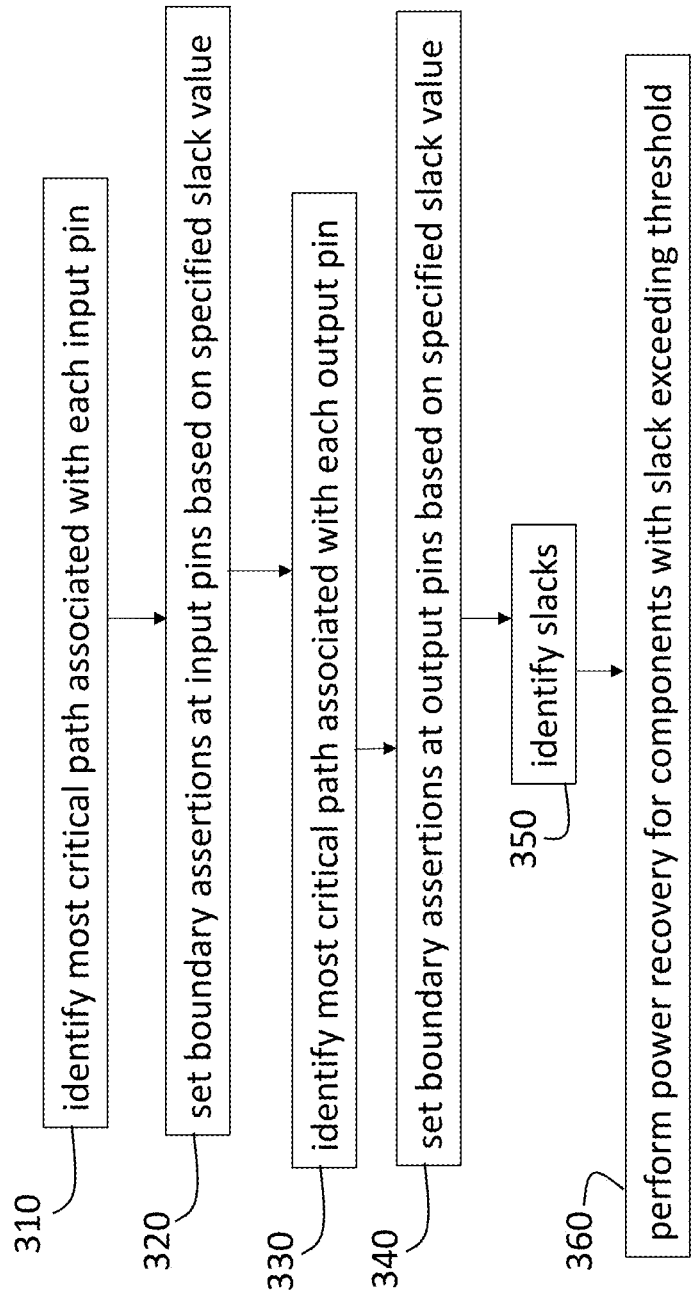
FIG. 3 is a process flow of a method of performing boundary assertion-based power recovery in integrated circuit design according to one or more embodiments of the invention.

FIG. 3 is a process flow of a method of performing boundary assertion-based power recovery in integrated circuit design according to one or more embodiments of the invention. The processes shown in FIG. 3 can be performed iteratively and at each hierarchical level. For example, the processes can be performed iteratively for each macro 220 and then, iteratively, for each unit 210 when the integrated circuit 120 is subdivided into units 210 that each include macros 220, as shown in FIG. 2. At block 310, identifying the most critical path associated with each input pin PI includes performing timing analysis without any adjustments of border assertions. A critical path refers to a path with an associated slack that is below a specified value. Because a given input pin PI or output pin PO can have more than one path associated with it, the most critical path is the one with the lowest associated slack.

For example, four paths originate from input pin PI-1. The first path involves nodes 201a and 201c and terminates at output pin PO-1. The second path involves nodes 201a, 201c, and 201d and terminates at output node PO-2. The third path involves nodes 201b, 201e, and 201d and terminates at output node PO-2. The fourth path involves nodes 201b, 201e, and 201f and terminates at output node PO-3. The path among these four that results in the lowest slack value is identified as the most critical path associated with input pin PI-1 at block 310.

At block 320, setting boundary assertions based on a specified slack value is a key process that facilitates managing pessimism in the power recovery process. Specifically, for each of the most critical paths identified (at block 310) for each of the input pins PI, slack is set (i.e., adjusted from the value used at block 310) to a specified value (e.g., 0, −5 ps). Specifically, arrival times at the input pins PI are set to achieve the specified value of the slack on the most critical path associated with each input pin PI.

At block 330, identifying the most critical path associated with each output pin PO includes performing timing analysis with the adjustments to boundary assertions at the input pins (at block 320). The identification of the most critical paths for both the input pins PI and the output pins PO is not done at the same time, at block 310, because it is possible for the adjustment of arrival time at a given input pin PI (at block 320) to affect the most critical path associated with the corresponding output pin PO. For example, the path from PI-1 through nodes 201b, 201e, and 201f to output pin PO-3 may be the most critical path associated with input pin PI-1 and output pin PO-3. The slack associated with this path may be −5 ps. The slack associated with the path from node 201j to output node PO-3 may be −3 ps, which is higher. If the arrival time is adjusted at input pin PI-1 (at block 320) to obtain a specified slack value of 0, for example, the path from node 201j to output node PO-3 (with a slack of −3 ps), which is unaffected by the adjustment of arrival time at any input pin PI, is now the most critical path associated with output pin PO-3. Addressing the input pins PI and output pins PO in turn facilitates addressing these types of affects.

At block 340, setting boundary assertions at output pins PO based on a specified slack value refers to setting the RAT at each output pin PO to ensure that the slack for the most critical path associated with the output pin PO is the specified slack value (e.g., 0, −2 ps). The processes at blocks 320 through 340 ensure that timing analysis for purposes of potential power recovery is not detrimentally affected by pessimism. As previously noted, the processes can be performed at different hierarchical levels.

At blocks 320 and 340, performing timing analysis is also specific to a given hierarchical level. For example, when the processes are performed at the macro level, performing timing analysis refers to determining the slack at the nodes 201 and output pins PO of each macro using arrival times at the input pins PI at each macro that are based on the specified slack (at block 320 and 340). At block 350, identifying slacks refers to determining whether the slack at each node and output pin PO is positive, negative, or zero. Because the processes at blocks 320 and 340 are designed to result in a specified slack in the most critical paths (identified at blocks 310 and 330), this process of identifying slacks pertains to all other paths. More particularly, identifying slacks can refer to identifying areas with positive slack that exceeds a threshold value. This facilitates performing power recovery for components with slack exceeding the threshold, at block 360.

At block 360, performing power recovery can include replacing components. For example, if the node 201b is a logic gate and if the slack positive slack at node 201b (i.e., at the input to edge 202g) exceeds the threshold, then the logic gate can be redesigned. As an example, a smaller logic gate that consumes less power can be used at node 201b. As previously noted, this process of redesigning components to recover power can be performed within each hierarchical level (e.g., at every macro 220) and across hierarchical levels (e.g., then at every unit 210).

Figure 4:
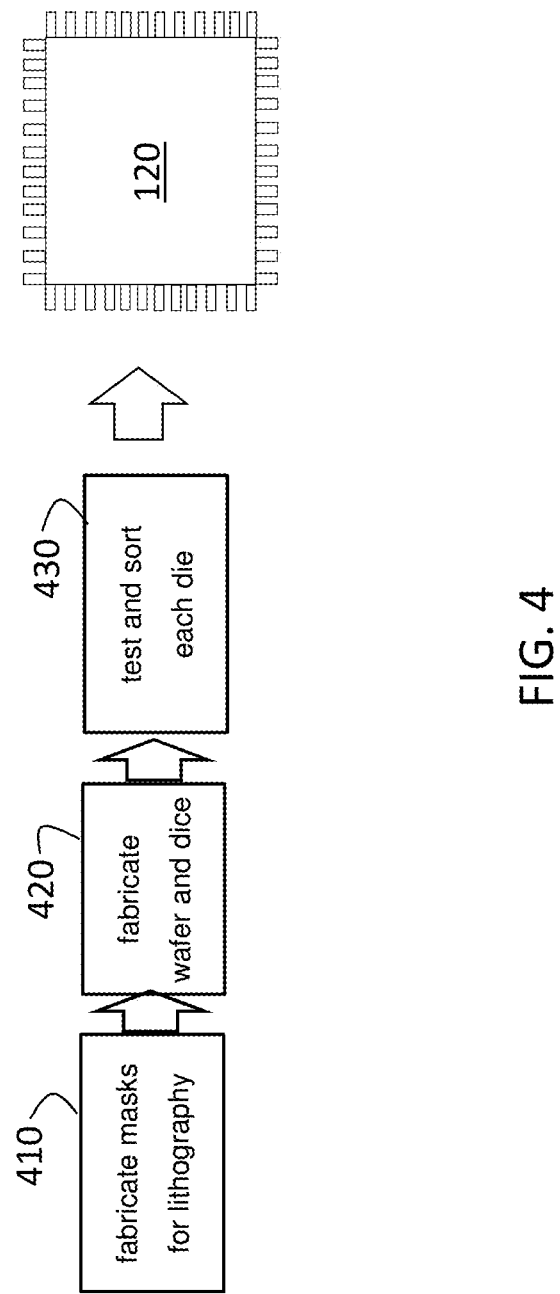
FIG. 4 is a process flow of a method of fabricating the integrated circuit designed according to one or more embodiments of the invention.

FIG. 4 is a process flow of a method of fabricating the integrated circuit 120 designed according to one or more embodiments of the invention. Once the physical design data is obtained, based, in part, on boundary assertion-based power recover according to one or more embodiments of the invention, the processes shown in FIG. 4 can be performed to fabricate the integrated circuit 120. Generally, a wafer with multiple copies of the final design is fabricated and cut (i.e., diced) such that each die is one copy of the integrated circuit 120. At block 410, the processes include fabricating masks for lithography based on the finalized physical layout. At block 420, fabricating the wafer includes using the masks to perform photolithography and etching. Once the wafer is diced, testing and sorting each die is performed, at block 430, to filter out any faulty die.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of performing boundary assertion-based power recovery in integrated circuit design, the method comprising:
   setting boundary assertions, using a processor, based on a specified slack value, wherein a boundary defines a set of components of the integrated circuit and the setting the boundary assertions includes specifying arrival times at input pins of the set of components and required arrival times at output pins of the set of components;
   performing, using the processor, timing analysis of the set of components, wherein the performing the timing analysis includes propagating the arrival times at the input pins through the set of components to output pins;
   identifying ones of the set of components based on slack values associated with the set of components, wherein the identifying the ones of the set of components includes identifying the slack values associated with the set of components that exceed a threshold
   performing the power recovery by replacing the ones of the set of components based on a result of the timing analysis; and
   providing the integrated circuit design for fabrication based on completing the power recovery.

2. The computer-implemented method according to claim 1, wherein the specified slack value is zero.

3. The computer-implemented method according to claim 1, wherein the specified slack value is a negative value.

4. The computer-implemented method according to claim 1, wherein each of the slack values associated with each of the set of components is a difference between arrival time and required arrival time.

5. The computer-implemented method according to claim 1, further comprising performing a first timing analysis to determine the arrival times at the input pins, and performing a second timing analysis after setting the arrival times at the input pins to determine the required arrival times at the output pins.

6. A system to perform boundary assertion-based power recovery in integrated circuit design, the system comprising:
a memory device configured to store the integrated circuit design; and
a processor configured to set boundary assertions based on a specified slack value, wherein a boundary defines a set of components of the integrated circuit and the setting the boundary assertions includes specifying arrival times at input pins of the set of components and required arrival times at output pins of the set of components, to perform timing analysis of the set of components, to perform the power recovery by replacing ones of the set of components based on a result of the timing analysis; and to provide the integrated circuit design for fabrication based on completing the power recovery, wherein the processor is configured to identify the ones of the set of components based on slack values associated with the set of components that exceed a threshold, and the timing analysis includes propagating the arrival times at the input pins through the set of components to output pins, and each of the slack values associated with each of the set of components is a difference between arrival time and required arrival time.

7. The system according to claim 6, wherein the specified slack value is zero.

8. The system according to claim 6, wherein the specified slack value is a negative value.

9. The system according to claim 6, wherein the processor is further configured to perform a first timing analysis to determine the arrival times at the input pins, and perform a second timing analysis after setting the arrival times at the input pins to determine the required arrival times at the output pins.

10. A computer program product for performing boundary assertion-based power recovery in integrated circuit design, the computer program product comprising a computer readable storage medium having program instructions embodied therewith, the program instructions executable by a processor to perform a method comprising:
setting boundary assertions based on a specified slack value, wherein a boundary defines a set of components of the integrated circuit and the setting the boundary assertions includes specifying arrival times at input pins of the set of components and required arrival times at output pins of the set of components;
performing timing analysis of the set of components, wherein the performing the timing analysis includes propagating the arrival times at the input pins through the set of components to output pins; and
identifying ones of the set of components based on slack values associated with the set of components, wherein the identifying the ones of the set of components includes identifying the slack values associated with the set of components that exceed a threshold; and
performing the power recovery by replacing the ones of the set of components based on a result of the timing analysis, wherein the integrated circuit design is provided for fabrication based on completing the power recovery.

11. The computer program product according to claim 10, wherein the specified slack value is zero.

12. The computer program product according to claim 10, wherein the specified slack value is a negative value.

13. The computer program product according to claim 10, wherein each of the slack values associated with each of the set of components is a difference between arrival time and required arrival time.

14. The computer program product according to claim 10, further comprising performing a first timing analysis to determine the arrival times at the input pins, and performing a second timing analysis after setting the arrival times at the input pins to determine the required arrival times at the output pins.

* * * * *